United States Patent [19]
Simpson, Jr.

[11] Patent Number: 6,064,528
[45] Date of Patent: May 16, 2000

[54] MULTIPLE LASER ARRAY SOURCES COMBINED FOR USE IN A LASER PRINTER

[75] Inventor: John M. Simpson, Jr., Webster, N.Y.

[73] Assignee: Eastman Kodak Company, Rochester, N.Y.

[21] Appl. No.: 09/197,302

[22] Filed: Nov. 20, 1998

[51] Int. Cl.⁷ .............................. G02B 27/10; G02F 1/00; G03B 27/52
[52] U.S. Cl. .............................. 359/619; 359/321; 355/40
[58] Field of Search ..................... 359/619, 321, 359/259, 620, 621, 626, 245, 254; 355/40

[56] References Cited

U.S. PATENT DOCUMENTS

| | | | |
|---|---|---|---|
| 4,786,918 | 11/1988 | Thornton et al. | 346/108 |
| 5,155,623 | 10/1992 | Miller et al. | 359/495 |
| 5,517,359 | 5/1996 | Gelbart | 359/623 |
| 5,519,432 | 5/1996 | Genovese | 347/260 |
| 5,521,748 | 5/1996 | Sarraf | 359/321 |
| 5,745,153 | 4/1998 | Kessler et al. | 347/241 |
| 5,900,981 | 5/1999 | Oren et al. | 359/619 |
| 5,923,475 | 7/1999 | Kurtz et al. | 359/619 |

*Primary Examiner*—Scott J. Sugarman
*Assistant Examiner*—Suzanne Letendre
*Attorney, Agent, or Firm*—David A. Novals; Nelson Adrian Blish

[57] ABSTRACT

A laser printer and an illumination system for the laser printer records onto light sensitive medial. The laser printer and illumination system includes laser diode arrays, array illumination optics and cross-array illumination optics. The cross-array illumination optics combine light beams from the laser diode arrays so as to illuminate a spatial light modulator and confine incident light within a cross-array width of the modulator.

11 Claims, 5 Drawing Sheets

MULTIPLE LASER ARRAY SOURCES COMBINED FOR USE IN A LASER PRINTER

CROSS REFERENCE TO RELATED APPLICATIONS

The present application is related to U.S. patent application Ser. No. 08/757,889, filed Nov. 27, 1996, by Andrew Kurtz and David Kessler titled "A Laser Printer Using A Fly's Eye Integrator".

FIELD OF THE INVENTION

This invention relates to laser printers using multiple laser diode array sources, each with a laser lenslet array, a spatial light modulator, an imaging system and a media plane.

BACKGROUND OF THE INVENTION

Laser printers, particularly flying spot printers, are used in a wide variety of applications, from office printing, to medical printing, to bar code printing. These systems typically print with a single lower power beam, onto fairly sensitive media. Other systems, such as those used in the graphic arts industry, often are configured as multispot printers to attain sufficient productivity. As many of the graphic arts media are rather insensitive to light exposure, each of these incident beams must provide a high light level in a small spot at the printing plane. The printer is typically configured like a "lathe", where the page scan is obtained by rotating a drum which holds the film, and line scan, by translating the multiple laser beams in a direction parallel to the axis of rotation of the drum.

There are several approaches to configuring a printhead so as to solve this problem. In one approach, each of the laser sources is separately coupled to optical fibers, which are then mounted to form a linear array of sources. Each of these channels can then be independently modulated. Such systems are described in U.S. Pat. Nos. 4,900,130 and 5,351,617. Another approach is to utilize a monolithic array of laser sources and then image the elements of the laser array directly onto the light sensitive media to produce multiple spots. Power to each element of the laser array is individually modulated to obtain pixel densities. Such a system, described by U.S. Pat. No. 4,804,975 is potentially of lower cost and higher efficiency as compared to systems which couple the lasers to optical fibers. However, these systems are significantly disadvantaged as the failure of even one lasing element will appear as an artifact in the printed image, requiring replacement of the entire laser array source.

One approach to improving a printing system using a monolithic laser diode array source is to split each lasing element into an array of subarray sources, such as described in U.S. Pat. No. 5,619,245. Each writing element is assembled from the combined light of all the lasing elements of a given subarray, and each of the subarrays are directly and individually modulated to provide the image data input. This approach desensitizes the system to the failure of the lasing elements within a subarray.

Yet another approach to improving the design of a printing system with a monolithic diode laser array source is to combine the light from each lasing element to flood illuminate a spatial light modulator. The elements of the modulator break up the light into image elements, and each element of the modulator is subsequently imaged onto the media plane to form the desired array of printing spots. Printing systems employing this approach are described in U.S. Pat. Nos. 4,786,918, 5,517,359, and 5,521,748. These systems improve upon the conventional designs by providing indirect light modulation means, so that the laser diode array operates at full power, and serves only as a light source. Also, as the light from the emitters typically illuminates the modulator in an overlapping fashion, the resulting redundancy desensitizes the system to the failure or poor behavior of any the lasing elements within the array.

One factor effecting the design of such systems is the degree of uniformity of the illumination provided to the modulator. The system of U.S. Pat. No. 4,786,918 essentially relies on far field averaging of single mode sources to improve the illumination profile. The systems of U.S. Pat. Nos. 5,517,359 and 5,521,748 image multi-mode emitting elements onto the modulator in overlapped fashion at high magnification, and are therefore sensitive to the macro- and micro-nonuniformities of the light emission profiles. U.S. Pat. No. 5,517,359 includes a mirror system which provides partial compensation by substantially removing the macro-nonuniformities, but at the cost of some reduced brightness. Another system, described in U.S. patent application Ser. No. 08/757,889, filed Nov. 27, 1996, and assigned to the same assignee as the present invention, provides a different approach for improving the illumination uniformity to the modulator plane, by means of a fly's eye integrator design.

The brightness of the illumination to the modulator and the media can also be very much a factor in the design of laser printers, such as the ones described in U.S. Pat. Nos. 5,517,359, and 5,521,748. Many new media have been developed recently, in response to environmental concerns, which are increasingly insensitive, thereby requiring high exposure levels, typically 0.2–0.5 joules/cm$^2$ or greater. Generally, these new media are thermally responsive to the absorbed laser light, with a high threshold required to induce the desired effect. As a result, the illumination to the media must have both a high power level and a high power density. For example, a laser array such as the Opto-power OPC-D020 laser (Opto Power Corporation, Tucson Ariz.), which emits 20 Watts from 19 emitters, each 150 $\mu$m wide, and spaced apart on a 650 $\mu$m pitch, can be used effectively in such a system. As the multi-mode laser diode array sources become increasingly brighter, emitting more light from smaller areas, further gains can be made. Eventually, an array of high power single mode emitters may be the ultimate source, provided that spatial coherence interference effects are minimal.

As an alternative to yet higher brightness laser array sources, it would be advantageous in the design of such laser printer systems to combine multiple laser diode array sources in order to illuminate the modulator, and then the media, with light at a higher power level and a higher power density. For example, it is well known in the art to combine light from polarized sources by means of polarization sensitive devices, such as polarization beam splitter cubes. For highly polarized light sources, polarization combining can be very advantageous, as the two beams can be completely overlapped, spatially, and angularly, thereby effectively increasing the brightness of the light downstream of the combiner relative to that of one source. Of course, polarization combining is difficult to employ if the system is polarization sensitive. For example, in a laser printer using a polarization sensitive modulator such as a PLZT device, the modulated contrast would be reduced by providing other than linearly polarized illumination. Likewise, wavelength combining can be used in similar fashion when multiple sources are of different wavelengths. This can be naturally valuable in a system such as a laser printer which creates color prints. Otherwise, for a nominally monochromatic system, care must be taken concerning the wavelength sensitivity of downstream elements, such as the modulator, optics, or recording media. Furthermore, if the light sources are of nominally the same wavelength, then exploiting small differences for the purposes of combining may be difficult both in terms of the design of the combiner and in the cost of source selection.

As another alternative to polarization or wavelength combining, spatial and angular combining can be used, although while the available power is increased, brightness is not. In such systems, the beams for the multiple sources are spatially or angularly adjacent. For example, the spatially variant mirror array of U.S. Pat. No. 5,155,623, Miller et al., allows two arrays of beams to be combined by introducing the light from the second array in the spatial gaps of the first. In U.S. Pat. No. 5,519,432, a roof mirror is used to combine two beams with angular adjacency, such that they appear to originate from a substantially coincident virtual point source. It can be important in such systems to minimize any residual spatial or angular gaps when light from multiple sources is combined by such means, as the system lagrange invariant is increased, or the net brightness is decreased.

SUMMARY OF THE INVENTION

It is an object of the present invention to provide for a means of combining the light from multiple laser diode arrays for use in a laser printer in a manner that increases the available light to a spatial light modulator and to the media.

The present invention relates to an illumination system which comprises at least one laser diode array that includes at least one row of laser diode emitters, with each of the laser diode emitters emitting a first light beam; array illumination optics for combining emitter beams and providing array direction flood illumination of a spatial light modulator array, with the spatial light modulator array comprising a plurality of modulator sites; and cross-array illumination optics for collecting the first light beams from the at least one laser diode array so as to illuminate the spatial light modulator array in a cross-array direction with a beam of light. The cross-array illumination optics confine incident light from the at least one laser diode array within a cross-array width of the spatial light modulator array.

The present invention further relates to a laser printer which comprises at least one laser diode array that includes at least one row of laser diode emitters, with each of the laser diode emitters emitting a first light beam; array illumination optics for combining emitter beams and providing array direction flood illumination of a spatial light modulator array, with the spatial light modulator array comprising a plurality of modulator sites; a print lens for imaging the spatial light modulator array onto the light sensitive media; and cross-array illumination optics for collecting the first light beams from the at least one laser diode array so as to illuminate the spatial light modulator array in a cross-array direction with a beam of light. The cross-array illumination optics confine incident light from the at least one laser diode array within a cross-array width of the modulator.

DETAILED DESCRIPTION OF THE INVENTION

Figure 1:
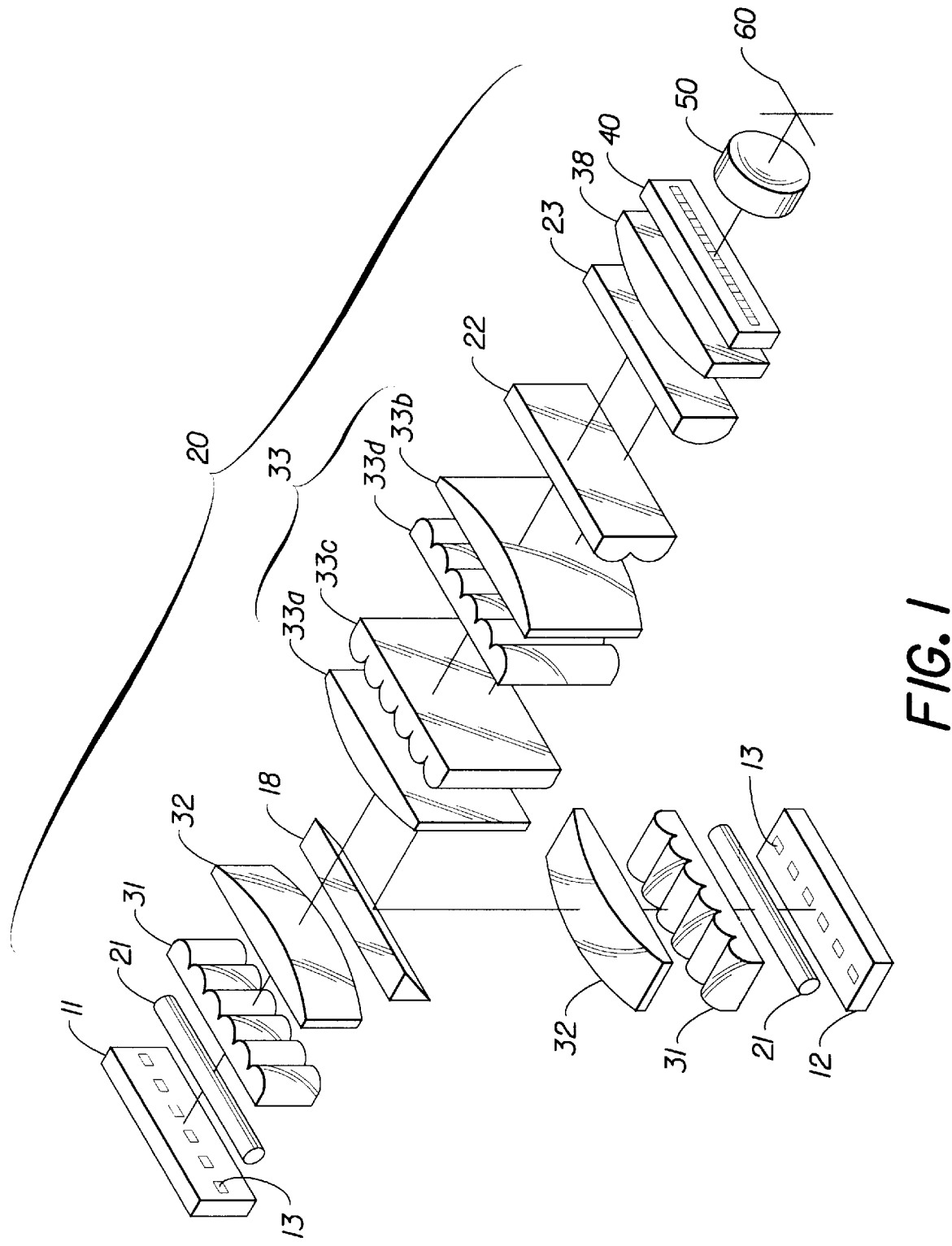
FIG. 1 is a perspective view of a laser printer according to the present invention.

Referring now to the drawings, wherein like reference numerals represent identical or corresponding parts throughout the several views, FIG. 1 illustrates a laser printer 10 in accordance with the present invention. More specifically, FIG. 1 illustrates a preferred embodiment of the present invention for a multi-laser array source for a laser printer, shown in the context of laser printer 10. Laser printer 10 is comprised of two laser diode arrays 11 and 12; illumination optics 20 which includes a beam combining reflector 18; a spatial light modulator 40; a print lens 50; and a receiver or media, located at a media plane 60.

Laser diode arrays 11 and 12 are each a high power array of laser diode emitters 13. The emitters can be formed in a single row as shown or multiple rows of emitters 13 could be utilized. Each of the rows would include its own microlens. As there is neither common spatial or temporal coherence for the light emitted by the two laser arrays 11, 12, the beams from the two laser arrays 11, 12 can be combined without causing interference effects. Emitters 13 of laser array 11 or 12 are each activated simultaneously in a CW (continuous wave) manner, possibly by means of a common power supply (not shown). The use of a CW laser without individual modulation simplifies the power supply and the heat dissipation systems. Although two laser diode arrays are shown, the present invention is not limited to this configuration. It is recognized that each array could be a double line array or a triple line array with each having its own individual microlens. It is further recognized that more than two arrays can be used.

All laser diode emitters 13 of each of laser diode arrays 11 and 12, by means of illumination optics 20, illuminate a long rectangular area of a specified size at spatial light modulator 40. In particular, the light from each of laser diode emitters 13 is mapped by illumination optics 20 to cover the full width of spatial light modulator 40, thereby providing source redundancy, and reducing the sensitivity of the system to the malfunction of any one of laser diode emitters 13.

A typical laser diode array which could be used in this system is an Optopower OPC-D020 laser (OptoPower Corporation, Tucson Ariz.). The OPC-D020 is a 20 Watt laser consisting of 19 diode multimode laser diode emitters, each 150 $\mu$m wide, and spaced apart on a 650 $\mu$m pitch. This laser emits linearly polarized light at 830 nm with an array NA (numerical aperture) of 0.13 and a cross-array NA of approx 0.63. Thus, the lagrange invariant in the array direction is ≅0.312 mm, while in the cross-array direction, with smile minimized, it is only ≅0.3 $\mu$m. Furthermore, unlike the array direction, where the laser diode emitters approximate miniature incoherent extended sources, in the cross-array direction the emitted beams are basically single spatial mode and gaussian in nature. Finally, diode laser arrays typically have a manufacturing artifact, referred to as cross-array smile, which is a deviation of the laser diode emitters in the cross-array direction, such that they are not located along a straight line. Frequently the emitters follow an arc (or smile) with a few microns (2–20) displacement from being straight. The pattern of the error can be more complex, and follow an "S" or "W" shape. In laser printer systems, where it is usually important to minimize the lagrange invariant, an uncorrected smile error can introduce undesirable increases in the cross-array numerical aperture or beam width downstream from the laser.

Illumination optics 20 are shown as anamorphic, meaning there are separate optical systems designed for the array and cross-array directions, as the light output by laser diode emitters 13 has vastly different characteristics in the two directions. It should be understood that some axially symmetrical components, with power in both directions, could also be used.

Illumination optics 20 include array illumination optics such as a laser lenslet array 31 and a combining field lens 32, which magnify and image laser diode emitters 13 together in overlapping fashion. In the system of FIG. 1, these overlapped images occur at an intermediate illumination plane which is located at the input of a fly's eye integrator uniformizer assembly 33. Fly's eye integrator uniformizer assembly 33 includes two field lenses 33a, 33b and two lenslet arrays 33c, 33d. The light at the intermediate illumination plane is broken into N portions, where N is the number of lenslet elements in each of lenslet arrays 33c, 33d of fly's eye integrator uniformizer assembly 33. These beam portions are then imaged and magnified by the second lenslet array 33d and field lens 33b of fly's eye integrator uniformizer assembly 33 and a field lens 38 in overlapping fashion onto spatial light modulator 40. As is described in U.S. patent application Ser. No. 08/757,889, the illumination of the modulator provided by the illumination optical system 20 which includes fly's eye integrator uniformizer assembly 33 improves the light beam uniformity in the array direction. The array optics could also be configured without fly's eye integrator uniformizer assembly 33, in which case, laser lenslet array 31 and combining field lens 32 would magnify and image laser diode emitters 13 directly onto spatial light modulator 40.

The illuminated spatial light modulator 40 is imaged onto media plane 60 by print lens 50 to create a line of closely packed writing spots. Print lens 50 is typically a multi-element assembly, which may either be axially symmetric or anamorphic. Depending on the type of spatial light modulator 40 used, additional optical elements may be included among the print lens elements as part of the modulation process. For example, for light polarization switching modulators, such as a PLZT device, a polarization analyzer, such as a beamsplitting cube, would be located downstream of the modulator. The spatial light modulator optimally is configured as an array of adjacent sites arranged in a linear row configuration, with a high optical fill factor (pixel size/pixel pitch ratio). The individual pixels are small, for example 60 μm wide and 20 μm high. Thus the active area of a modulator array with 256 pixel sites will be 15.4 mm long by 20 μm wide.

In systems such as that of FIG. 1, the design of print lens 50 is driven by the array direction specifications of the laser diode array source and the spatial light modulator. As noted previously, for the OPC-D020 lasers, the array direction lagrange of the laser arrays is 1000× greater than that in the cross-array direction. Thus, even when emitters 13 are magnified over the full width of spatial light modulator 40, the NA collected by print lens 50 in the array direction may still be larger than the cross-array NA collected exiting the modulator plane. The design of print lens 50 is therefore typically driven by the array direction field and NA specifications at the modulator plane. As a result of this large lagrange mismatch between the array direction and cross-array direction light, it is advantageous to combine the beams from the multiple laser diode array sources in the cross-array direction, rather than in the array direction (assuming the laser diode array is smile corrected). The beams from the multiple laser array sources are basically combined by means of NA addition.

Figure 2:
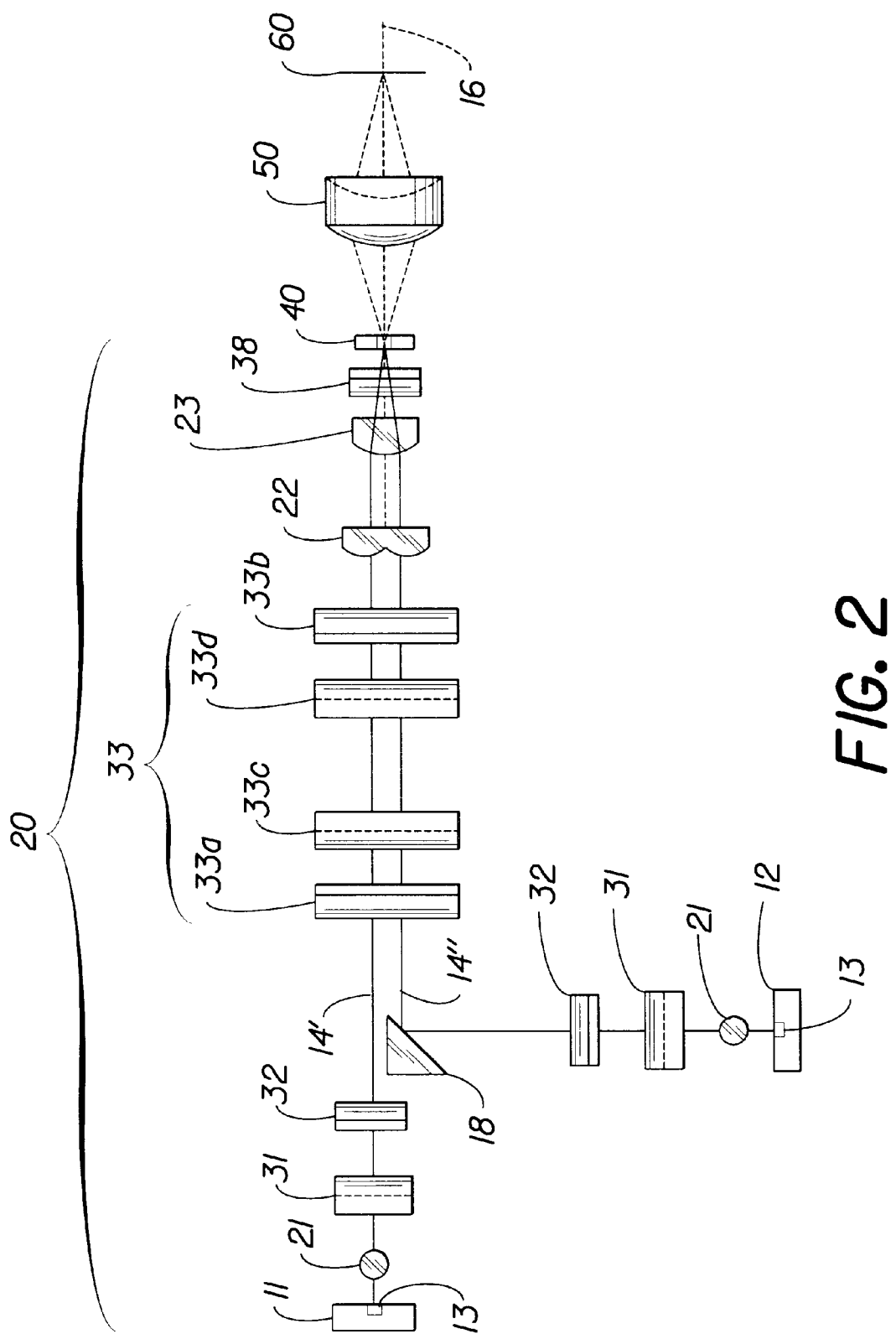
FIG. 2 is a side view plan of a portion of the invention shown in FIG. 1, showing additional details of the optics arrangement, and particularly of the optical layout before the modulator.

In the system of FIG. 1, illumination optics 20 also include several cross-array illumination optics or beam conditioning optical elements, particularly a cylindrical micro-lens 21, reflector 18, a cylindrical field lenslet array 22, and a cylindrical focusing lens 23. FIG. 2 provides a cross sectional view of the system, which shows more clearly the cross-array components. The cross-array optics may also include components or opto-mechanical means (not shown) for correcting cross-array smile error. In general, the cross-array optical system is designed to confine the light within the vertical width of spatial light modulator 40 while minimizing the cross-array NA. This can be accomplished by imaging laser diode emitters 13 to spatial light modulator 40. Alternatively, as an assist in desensitizing the system to laser array smile error, the back focal plane of cylindrical micro-lens 21 can be imaged to spatial light modulator 40.

In the cross-array direction, the gaussian beams eminating from each laser diode emitter 13 are nominally collimated by cylindrical micro-lens 21. There are several types of cylindrical micro-lenses that are commercially available, including lenses with non-spherical profiles from Blue Sky Research Inc. (Santa Cruz, Calif.) and lenses with gradient index cores from Doric Lenses Inc. (Ancienne-Lorette, Quebec, Canada). For example, a Doric D150 Lens with a 150 μm diameter and a 103 μm focal length will project a "collimated" beam of 130 μm full width. Assuming that the laser smile follows a simple arc, cylindrical micro-lens 21 can also be mounted along an arc. By this means, smile is functionally eliminated with a simple bending, while introducing negligible growth in the beam size and negligible skew ray effects.

Figure 3:
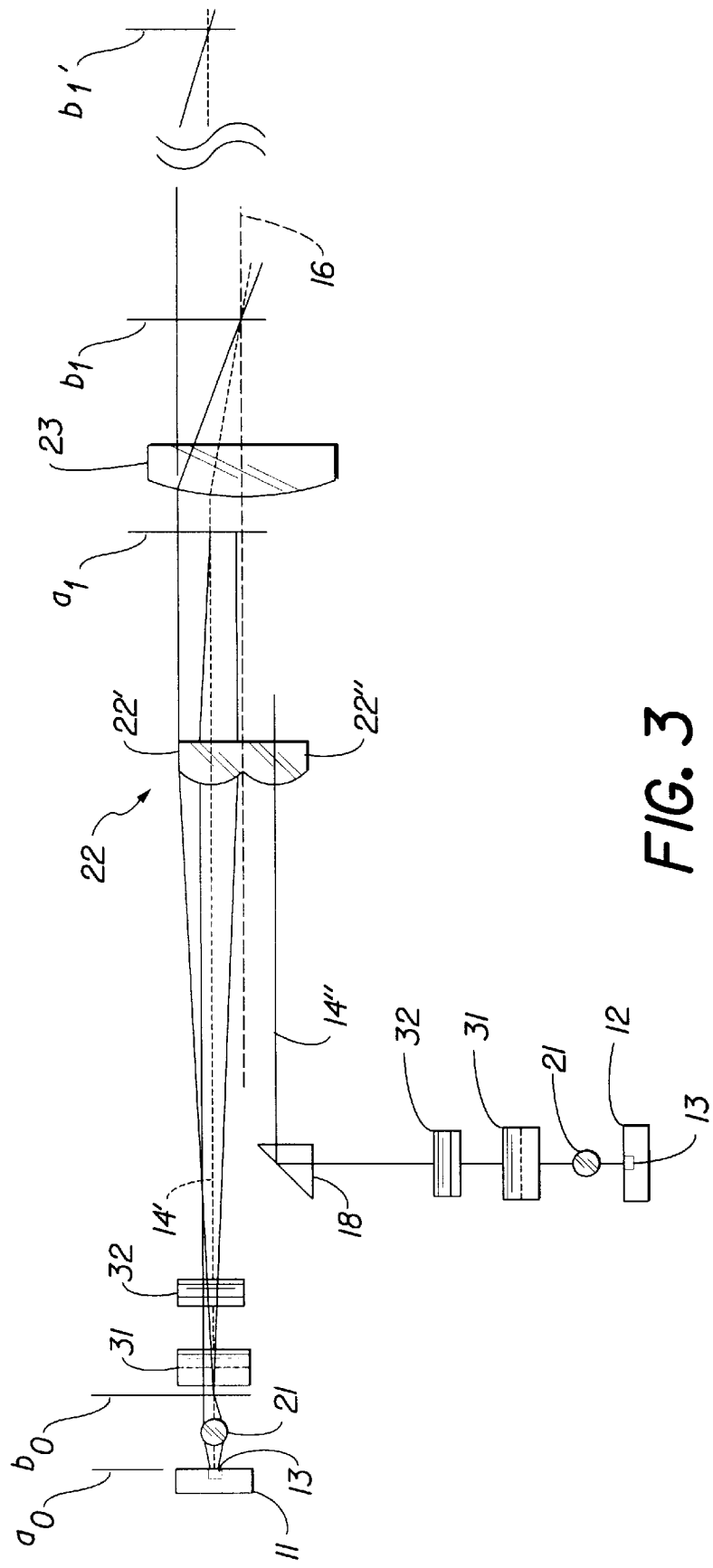
FIG. 3 is a further detailed view of that of FIG. 2, emphasizing the functional design of the cross-array optical system.
Figure 4:
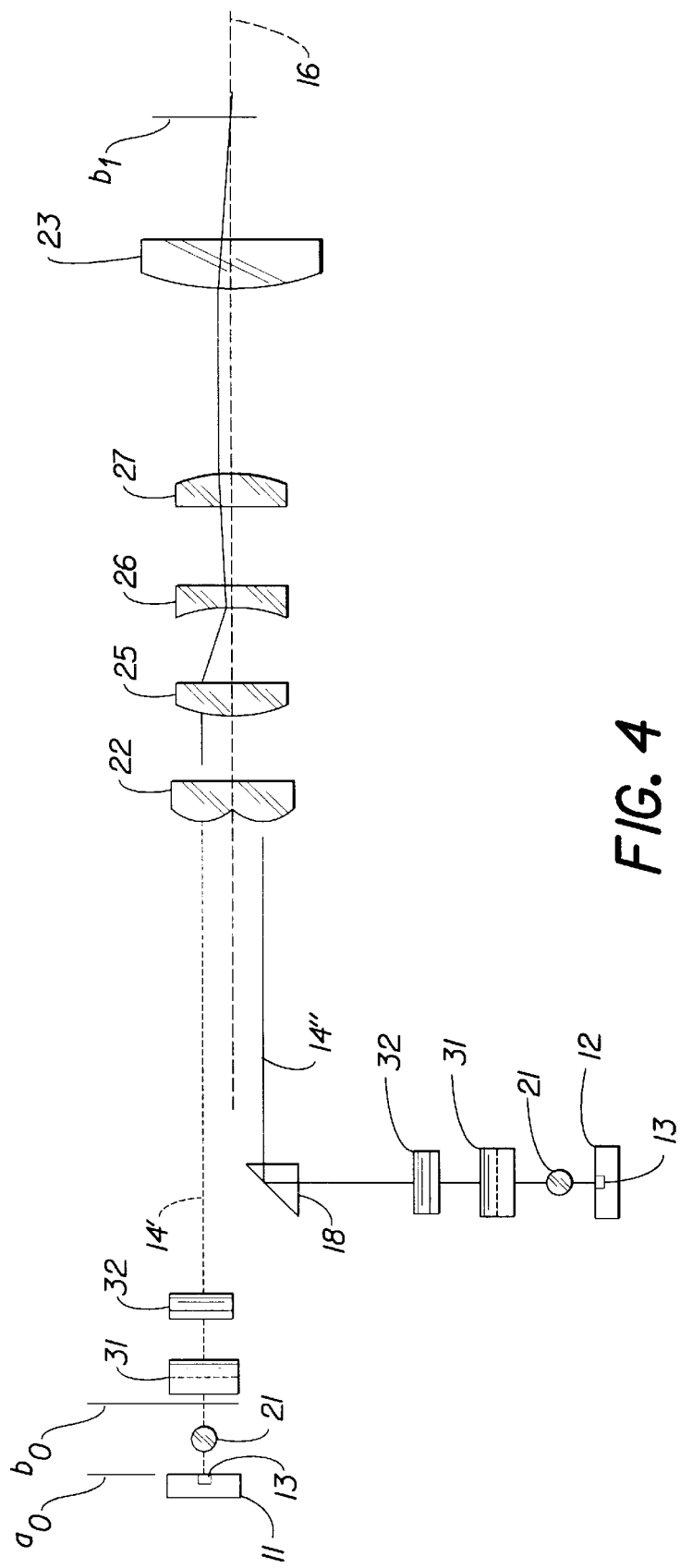
FIG. 4 is a side view of an alternative embodiment of the system of FIG. 1, which includes three cross-array elements for providing a variable magnification function.

As shown in FIG. 2, the beam propagating away from the second laser source, laser diode array 12, is redirected by reflector 18, to follow an optical axis 14", which is substantially parallel to optical axis 14' of the beam propagating from the first laser source, laser diode array 11. These two beam axes 14' and 14" are also parallel to, and nominally equidistant from, the system optical axis, indicated by line 16. Reflector 18 can be an external surface mirror, with a dielectric or metal coating, as shown in FIGS. 1 and 2, or a 45 degree right angle prism, with total internal reflection, as shown in FIGS. 3 and 4. Reflector 18 has its mirror surface nominally arranged at 45 degrees to the system optical axis 16.

FIG. 3 is a side view similar to that of FIG. 2, except that it shows the cross-array direction ray paths and conjugate planes, while most of the array direction elements have been removed for simplicity. Plane $a_0$ is the plane in which laser diode array 11 is located, and plane $a_1$ is conjugate to it. Plane $b_0$ is the back focal plane of cylindrical microlens 21, and plane $b_1$ is conjugate to it. Plane $b_1$ also corresponds to the nominal location of spatial light modulator 40. Laser diode array 12 has equivalent planes $a_0$ and $b_0$ which are not shown and would be based on the orientation of laser diode array 12. Cross-array field lenslet array 22 consists of two adjacent lens elements 22' and 22", which correspond to the two laser diode arrays 11 and 12, and which are centered to the respective optical axes 14' and 14". In the cross-array direction, the beams from each of laser diode arrays 11 and 12 nominally fill the clear aperture of its corresponding lenslet 22' and 22". Lenslet 22' effectively acts as a field lens for the optical system for laser diode array 11. Lenslet 22', together with cylindrical microlens 21 (FIG. 1), images laser diode emitters 13 of laser diode array 11 to plane $a_1$, which is located in proximity to focusing lens 23. Lenslet 22' also images back focal plane $b_0$ of cylindrical microlens 21. In a lens system without focusing lens 23, this image would occur at a distant plane $b_1'$, which would lie on optical axis 14'. In the preferred embodiment of this invention, lenslet 22' nearly collimates the incoming light with respect to plane $b_0$, and therefore distant image plane $b_1$ is nearly at infinity. However, with the inclusion of focusing lens 23, the image is moved forward to plane $b_1$ as shown, which is located approximately one focal length away from focusing lens 23. This image at plane $b_1$ is aligned to the system optical axis 16. For second diode laser array 12, a similar process occurs, such that the image of the back focal plane of its cylindrical microlens 21 is cast by its cross-array lenslet 22", onto image plane $b_1$, such that it is aligned with system optical axis 16 and is coincident with the image cast by the system of first laser diode array 11. Therefore, the beams are coincident at spatial light modulator 40.

Focusing lens 23 combines the two beams together at a common location on plane $b_1$, where spatial light modulator 40 is located, and which is then reimaged to media plane 60 by print lens 50. As the beams from the multiple laser diode array sources 11, 12 are combined in the cross-array direction at a common point, it is important that the beams nominally fill, or slightly underfill, the width of the modulator pixels of spatial light modulator 40. Depending on the type of modulator, cross-array overfilling of the pixels can reduce system efficiency and modulated contrast ratio, as well as potentially cause damage to the modulator device. In order to minimize the overall system lagrange invariant, it is important that these two beams propagate forward as one beam after the modulator, with negligible angular separation. To keep the beams from separating when they are not in focus, the beams from the respective diode lasers must overlap, or nearly overlap, earlier in the system. To accomplish this, the reflector 18 is positioned so that the beams from the two diode laser arrays 11 and 12 travel parallel paths with a negligible or minimal gap between them. As shown in FIG. 3, the beam from laser diode array 11 just fills its' cross-array lenslet 22'. Likewise, the beam from laser diode array 12 will just fill its' cross-array lenslet 22". The center to center pitch between the two lenslets 22' and 22" is then equal to the width of the lenslets.

For example, the projected gaussian beam full width from laser array 11 at lenslet 22' is approximately 1.2 mm. Lenslet 22' is then 1.2 mm wide, is offset from lenslet 22" by a pitch of 1.2 mm, and is offset from the system optical axis 16 by 0.6 mm. In the nominal first order design cylindrical microlens can be a 103 $\mu$m focal length Doric Lens, and the focal lengths of lenslets 22' and 22" are each ≅124 mm. Therefore, in each system, the emitters 13 are magnified ≅1200× in the cross-array direction, to create images of the emitters at the $a_1$ plane ≅1.2 mm in size. These emitter images from laser diode arrays 11 partially overlap in the cross-array direction with those of laser array 12 at the $a_1$ plane. Therefore, between the cross-array field lenslet array 22 to the focusing lens 23, the parallel beams from the two laser diode arrays 11 and 12 are in such close proximity spatially that they begin to merge. Alternatively, it can be considered that two adjacent gaussian beam waists will be located at the $a_1$ plane, and as the beams continue forward they will increasingly overlap. By combining the beams in this way, any angular separation between the two beams is minimized beyond the focus at the modulator plane $b_1$. The two beams are combined in the cross-array direction by way of angular addition with minimal gaps in the angular spectrum. Thus, the two beams, in effect, become one.

Focusing lens 23 shown in FIG. 3 is a plano-convex singlet, which could for example, have a focal length of ≅16 mm. Then, the beams from each laser array will be incident onto spatial light modulator 40 with a cross-array width of 18 $\mu$m and an NA of 0.034 (assuming laser smile error is well corrected). When combined, the beams from the two laser diode arrays 11, 12 will overlap spatially with nominally the same 18 $\mu$m width, but with numerical aperture addition, so that the combined NA is ≅0.068. Focusing lens 23 can actually comprise one or more lens elements, which may be plano convex, meniscus lenses, aspheric lenses, etc., as is required by performance and cost considerations. The lensing surfaces of field lenslet array 22 can likewise be simple plano convex surfaces, or more complicated aspheric surfaces.

In FIG. 4, an alternative embodiment of the system is shown, which utilizes a zoom system in the form of a positive-negative-positive set of three cylinder lenses, 25, 26, and 27, which are positioned between lenslet array 22 and focusing lens 23. With the addition of these lens elements, configured in the positive-negative-positive arrangement, the cross-array optical system now includes a variable magnification function. By changing the position of the these three elements relative to each other, the net magnification of the cross-array system is changed, which in turn changes the cross-array beam width at modulator plane $b_1$. To some extent, the axial position of the $b_1$ plane along the system optical axis 16, can also be tuned. By including this three lens variable magnification system, the overall system has added flexibility for compensating for variations in the quality of the cross-array beams coming from the laser diode array sources.

As illustrated in the various figures, reflector 18 is located well before lenslet array 22, in the space before Fly's eye integrator uniformizer assembly 33. Alternately, reflector 18 could be placed in proximity to lenslet array 22. In changing these relationships, as the cross-array beams from the two laser diode arrays 11, 12 enter the space before the focusing lens 23, it is important that they appear to come from a common source.

Figure 5:
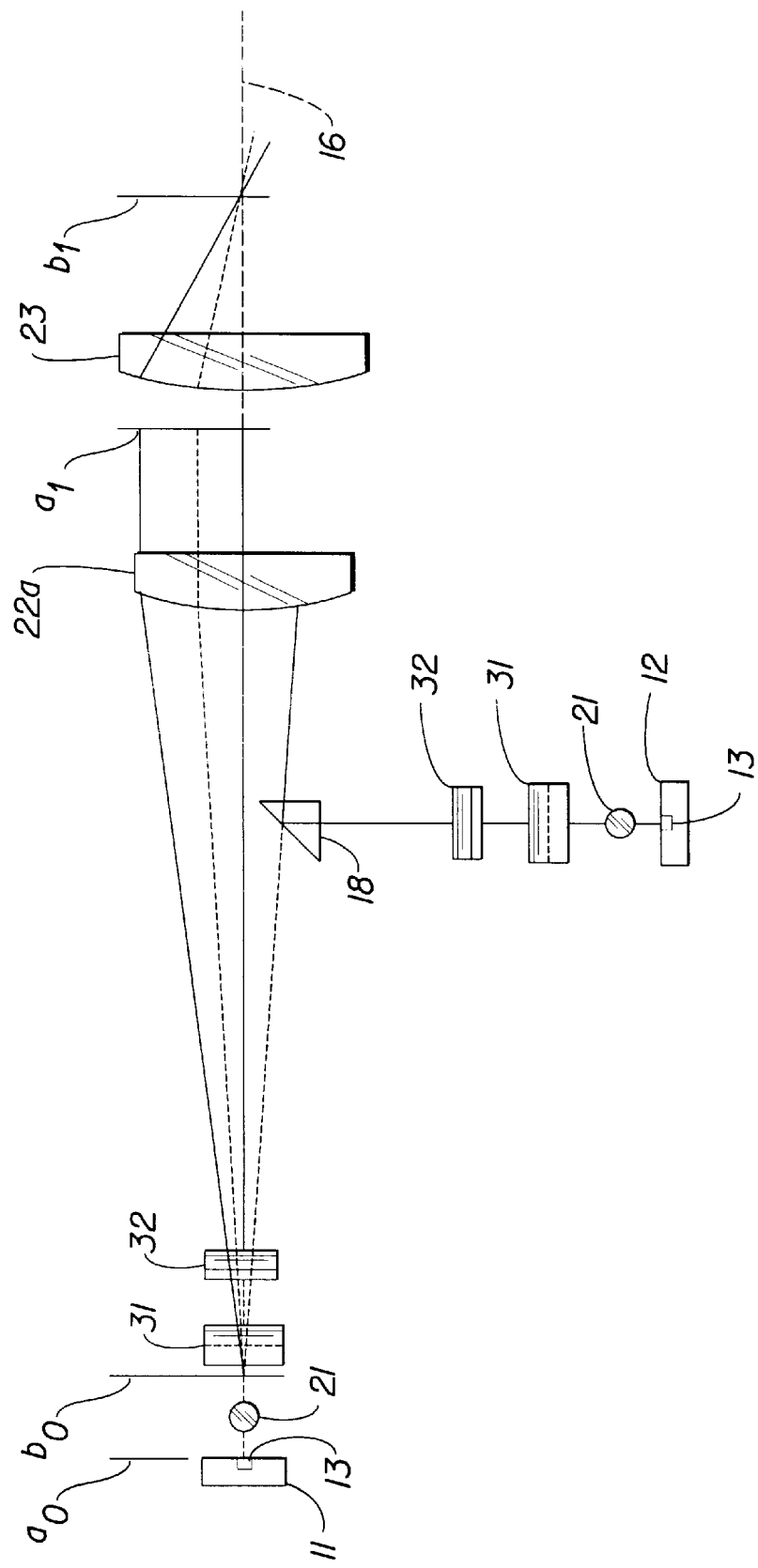
FIG. 5 is an alternative embodiment of the system of FIG. 1, in which the field lens is a single element and the input beams are tilted with respect to the field lens.

For example, lenslet array 22 could be reconfigured as a single field lens 22a rather than a side by side pair, as is shown in FIG. 5. The beams from the two laser diode arrays 11 and 12 are input at a tilt with respect to system optical axis 16, such that the two beams appear to originate from a common point. This common point is ideally at back focal plane $b_0$ of cylindrical micro-lens 21, and is also near the focal point of field lens 22. In FIG. 5, the beam from laser diode array 11 is tilted directly, whereas the beam from laser diode array 12 enters the system via reflector 18, which is no longer a 45 degree right angle prism, but a right angle prism cut at some custom angle. Alternately, reflector 18 could still be a 45 degree right angle prism or a mirror, but be oriented with the appropriate tilt.

Reflector 18 could also be located after the field lens, in which case, each of the laser diode array, such as 11 and 12, would have its own field lens 22, rather than sharing one. However, two sets of many of the other components, particularly Fly's eye integrator uniformizer assembly 33 would be needed. However, in a simplified system, without Fly's eye integrator uniformizer assembly 33, it may be more practical or advantageous to employ these alternative options for positioning the reflector and field lens for combining the two beams.

It should also be understood that while the discussion and figures are illustrative of a system configured with just two laser diode arrays 11 and 12, the system could be configured with yet more sources. A "light house lens" arrangement could be used to multiplex several diode laser arrays. As more sources are added, limitations will arise from the increasing complexity and cost of the overall system, if not from the cross-array NA at modulator plane $b_1$ and at media plane 60 becoming larger and larger.

The invention has been described in detail with particular reference to certain preferred embodiments thereof, but it will be understood that variations and modifications can be effected within the spirit and scope of the invention.

What is claimed is:

1. An illumination system comprising:
    at least one laser diode array comprising at least one row of laser diode emitters, each of said laser diode emitters emitting a first light beam;
    array illumination optics for combining emitter beams and providing array direction flood illumination of a spatial light modulator array, said spatial light modulator array comprising a plurality of modulator sites;
    cross-array illumination optics for collecting the first light beams from said at least one laser diode array so as to illuminate the spatial light modulator in a cross-array direction with a beam of light, said cross-array illumination optics confining incident light from said at least one laser diode array within a cross-array width of the spatial light modulator;
    wherein said cross-array illumination optics comprise a cylindrical micro-lens, a cylindrical field lens, and a cylindrical focusing lens;
    a second laser diode array which comprises at least one row of laser diode emitters which each emit a second light beam; and
    a reflector which directs the second light beams from said second laser diode array into paths which are parallel and closely adjacent to paths of said first light beams from said at least one laser diode array.

2. An illumination system according to claim 1, wherein said cylindrical field lens is a lenslet array which comprises multiple adjacent lenses having the same focal length, said cylindrical field lens imaging the first and second light beams from the at least one and the second laser diode arrays into parallel closely adjacent and overlapping paths.

3. An illumination system according to claim 1, wherein said focusing lens combines said first and second light beams to be coincident at said spatial light modulator array.

4. An illumination system according to claim 1, where said cylindrical field lens images said emitters of said at least one and said second laser diode arrays to a location in proximity to said cylindrical focusing lens.

5. An illumination system according to claim 1, wherein said first and second light beams share a common cylindrical field lens, and said first and second light beams are tilted with the respect to said cylindrical field lens such that they appear to be coming from a common point which is located one focal length away from said cylindrical field lens.

6. An illumination system according to claim 1, wherein said first and second light beams pass through a common zoom system consisting of three cylindrical lens elements located after said cylindrical field lens.

7. An illumination system according to claim 6, wherein said zoom system uses a positive-negative-positive lens arrangement.

8. A laser printer comprising:
    at least one laser diode array which comprises at least one row of laser diode emitters, each of said laser diode emitters emitting a first light beam;
    array illumination optics for combining emitter beams and providing array direction flood illumination of a spatial light modulator array, said spatial light modulator array comprising a plurality of modulator sites;
    a print lens for imaging the spatial light modulator array onto the light sensitive media;
    cross-array illumination optics for collecting the first light beams from the at least one laser diode array so as to illuminate the spatial light modulator array in a cross-array direction with a beam of light, said cross-array illumination optics confining incident light from said at least one laser diode array within a cross-array width of the modulator; and
    a second laser diode array which comprises at least one row of laser diode emitters which each emit a second light beam.

9. A laser printer according to claim 8, wherein said cross-array illumination optics comprises a cylindrical focusing lens.

10. A laser printer according to claim 8, wherein said focusing lens combines said first and second light beams to be coincident at said spatial light modulator array.

11. A laser printer according to claim 8, further comprising:
    a reflector which directs the second light beams from said second laser diode array into paths which are parallel and closely adjacent to paths of said first light beams from said at least one laser diode array.

* * * * *